United States Patent
Basker et al.

(10) Patent No.: US 8,912,612 B2
(45) Date of Patent: Dec. 16, 2014

(54) SILICON NITRIDE GATE ENCAPSULATION BY IMPLANTATION

(71) Applicant: International Business Machines Corporation, Armonk, NY (US)

(72) Inventors: Veeraraghavan S. Basker, Schenectady, NY (US); Sanjay Mehta, Niskayuna, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/015,634

(22) Filed: Aug. 30, 2013

(65) Prior Publication Data

US 2014/0239401 A1    Aug. 28, 2014

Related U.S. Application Data

(63) Continuation of application No. 13/776,324, filed on Feb. 25, 2013.

(51) Int. Cl.
*H01L 29/78* (2006.01)
*H01L 29/66* (2006.01)

(52) U.S. Cl.
CPC .................................. *H01L 29/785* (2013.01)
USPC ........... 257/412; 438/423; 438/659; 438/304; 438/177; 438/157; 438/156; 438/182; 438/506; 438/302; 438/183

(58) Field of Classification Search
CPC ...................... H01L 29/66795; H01L 29/7851; H01L 29/7831; H01L 29/785; H01L 21/3211; H01L 29/66803; C23C 14/0652; C23C 16/345

USPC ......... 438/423, 659, 304, 177, 157, 156, 182, 438/183, 193, 197, 230, 506
See application file for complete search history.

(56) References Cited

U.S. PATENT DOCUMENTS

| | | | |
|---|---|---|---|
| 4,417,385 A * | 11/1983 | Temple | 438/138 |
| 6,238,998 B1 | 5/2001 | Leobandung | |
| 6,853,020 B1 | 2/2005 | Yu et al. | |
| 7,187,046 B2 | 3/2007 | Wu et al. | |

(Continued)

OTHER PUBLICATIONS

Prosecution History of related U.S. Appl. No. 13/776,324, Office Action mailed Dec. 31, 2013, all pages.

(Continued)

*Primary Examiner* — Jarrett Stark
*Assistant Examiner* — Bitew Dinke
(74) *Attorney, Agent, or Firm* — Law Offices of Ira D. Blecker, P.C.

(57) ABSTRACT

A FinFET structure which includes: silicon fins on a semiconductor substrate, each silicon fin having two sides and a horizontal surface; a gate wrapping around at least one of the silicon fins, the gate having a first surface and an opposing second surface facing the at least one of the silicon fins; a hard mask on a top surface of the gate; a silicon nitride layer formed in each of the first and second surfaces so as to be below and in direct contact with the hard mask on the top surface of the gate; spacers on the gate and in contact with the silicon nitride layer; and epitaxially deposited silicon on the at least one of the silicon fins so as to form a raised source/drain.

5 Claims, 13 Drawing Sheets

(56) References Cited

U.S. PATENT DOCUMENTS

| | | | |
|---|---|---|---|
| 7,485,516 B2 | 2/2009 | Dyer et al. | |
| 7,564,105 B2 | 7/2009 | Chi et al. | |
| 7,737,501 B2 * | 6/2010 | Zhu et al. | 257/365 |
| 7,905,199 B2 | 3/2011 | Hautala et al. | |
| 7,982,196 B2 | 7/2011 | Hautala et al. | |
| 8,138,031 B2 * | 3/2012 | Yagishita | 438/151 |
| 8,466,012 B1 * | 6/2013 | Chang et al. | 438/149 |
| 2002/0106876 A1 | 8/2002 | Chen | |
| 2003/0134471 A1 * | 7/2003 | Su et al. | 438/257 |
| 2004/0056315 A1 * | 3/2004 | Ueno et al. | 257/389 |
| 2004/0219722 A1 * | 11/2004 | Pham et al. | 438/157 |
| 2006/0244077 A1 * | 11/2006 | Nowak | 257/394 |
| 2007/0063261 A1 * | 3/2007 | Chen et al. | 257/316 |
| 2007/0072380 A1 * | 3/2007 | Wirbeleit et al. | 438/303 |
| 2007/0111416 A1 * | 5/2007 | Huang et al. | 438/197 |
| 2007/0148845 A1 * | 6/2007 | Jung | 438/197 |
| 2008/0001187 A1 * | 1/2008 | Booth et al. | 257/288 |
| 2008/0119031 A1 * | 5/2008 | Pal et al. | 438/483 |
| 2008/0290422 A1 * | 11/2008 | Nowak | 257/384 |
| 2009/0263949 A1 * | 10/2009 | Anderson et al. | 438/285 |
| 2010/0041186 A1 * | 2/2010 | Surdeanu | 438/151 |
| 2010/0044794 A1 * | 2/2010 | Cheng | 257/347 |
| 2010/0078728 A1 * | 4/2010 | Li et al. | 257/369 |
| 2011/0020987 A1 * | 1/2011 | Hareland et al. | 438/151 |
| 2011/0201164 A1 * | 8/2011 | Chung et al. | 438/229 |
| 2011/0266608 A1 * | 11/2011 | Lee et al. | 257/315 |
| 2012/0032275 A1 * | 2/2012 | Haran et al. | 257/401 |
| 2012/0211838 A1 * | 8/2012 | Kronholz et al. | 257/369 |
| 2012/0261743 A1 * | 10/2012 | Shukuri | 257/326 |
| 2013/0193526 A1 * | 8/2013 | Lo et al. | 257/401 |

OTHER PUBLICATIONS

Prosecution History of related U.S. Appl. No. 13/776,324, Amendment to Office Action, filed Mar. 30, 2014, all pages.

Prosecution History of related U.S. Appl. No. 13/776,324, Office Action mailed May 13, 2014, all pages.

Prosecution History of related U.S. Appl. No. 13/776,324, Amendment to Office Action, filed Jul. 11, 2014, all pages.

J. Farges et al., Structure and temperature of rare gas clusters in a supersonic expansion, Surface Science, vol. 106, Issues 1-3, May 1, 1981, pp. 95-100.

Y.-K. Choi et al., "FinFET process refinements for improved mobility and gate work function engineering," Digest. International Electron Devices Meeting, IEDM '02, 2002, pp. 259-262. The Year of Publication is Sufficiently Earlier Than Applicants' Effective US and Foreign Filing Date Such That the Particular Month of Publication is not an Issue.

I. Yamada et al., "Gas Cluster Ion Beam Processing for ULSI Fabrication," J. Material Resources Society Symposium Proceedings, vol. 427, 1996, pp. 265-274. The Year of Publication is Sufficiently Earlier Than Applicants' Effective US and Foreign Filing Date Such That the Particular Month of Publication is not an Issue.

R. MacCrimmon et al., "Gas cluster ion beam infusion processing of semiconductors," Nuclear Instruments and Methods in Physics Research Section B: Beam Interactions with Materials and Atoms, vol. 241, Nos. 1-4, Dec. 2005, pp. 641-644.

Prosecution History of related U.S. Appl. No. 13/776,324, Notice of Allowance mailed Aug. 4, 2014, all pages.

\* cited by examiner

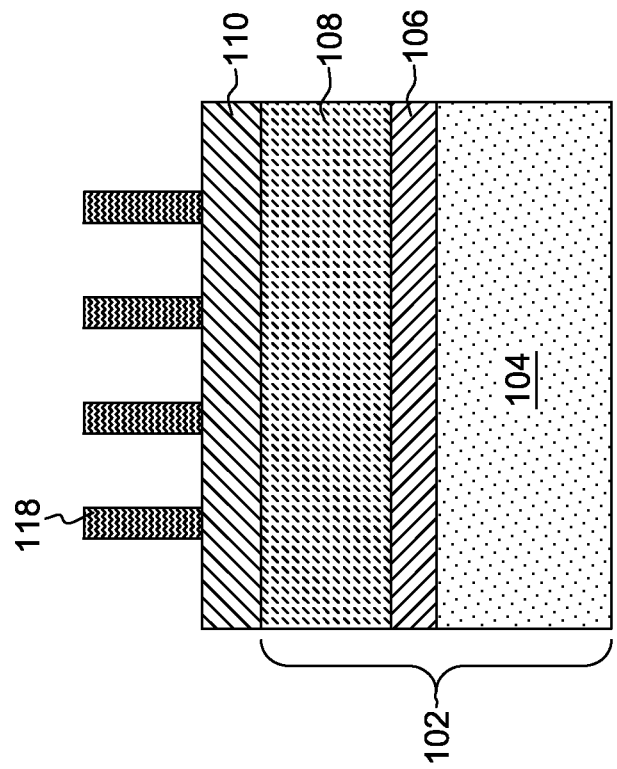
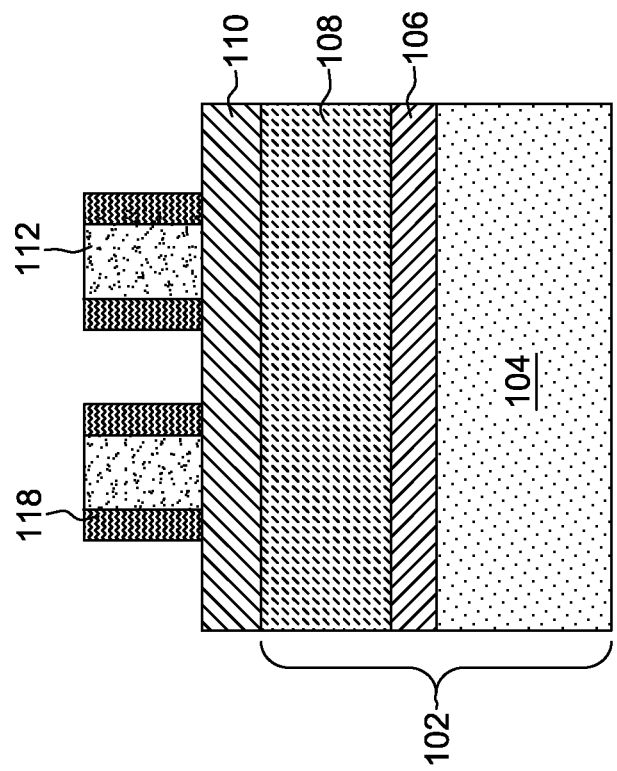

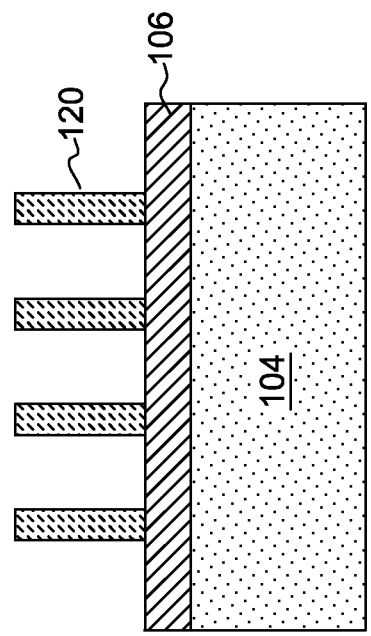
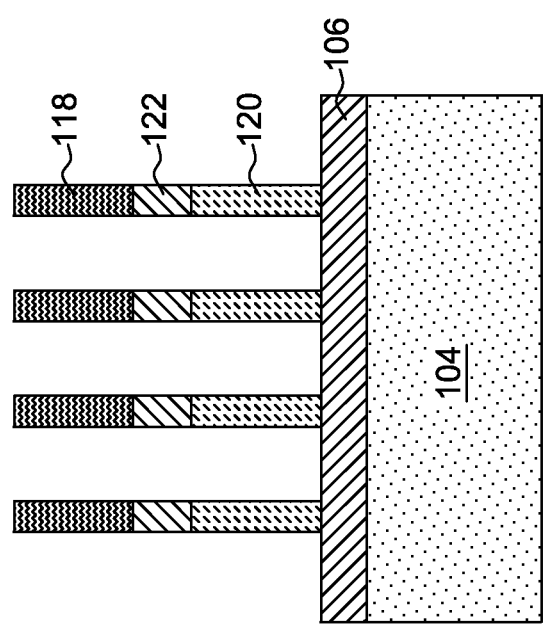

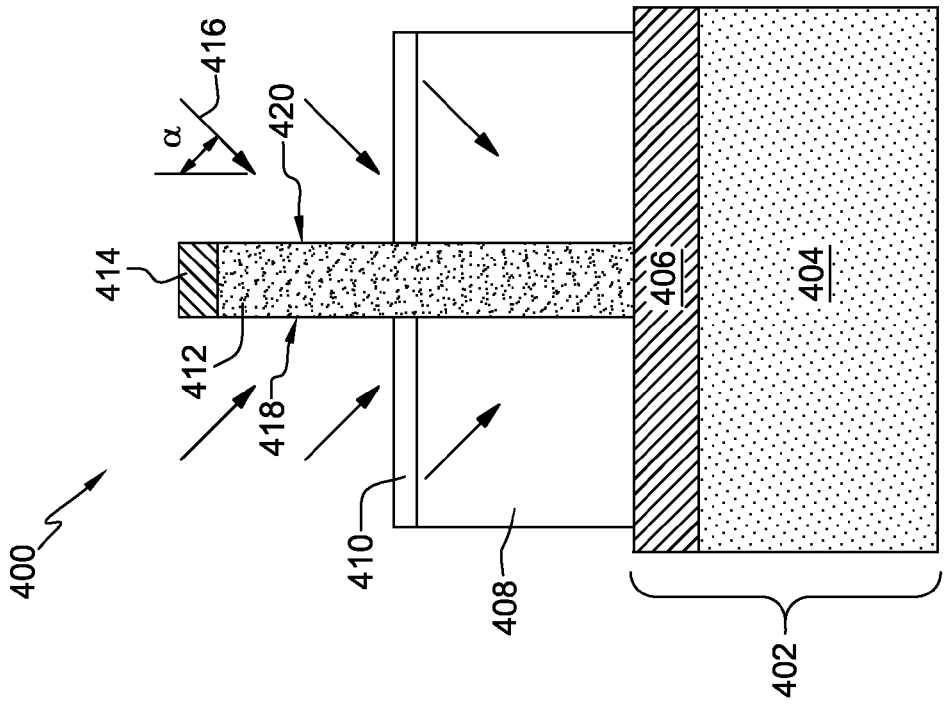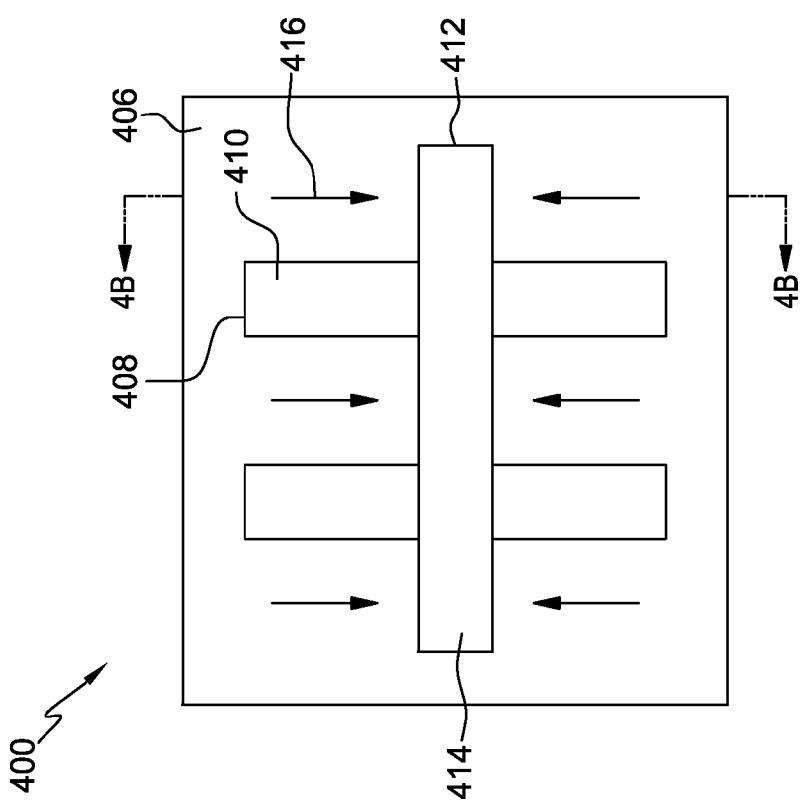

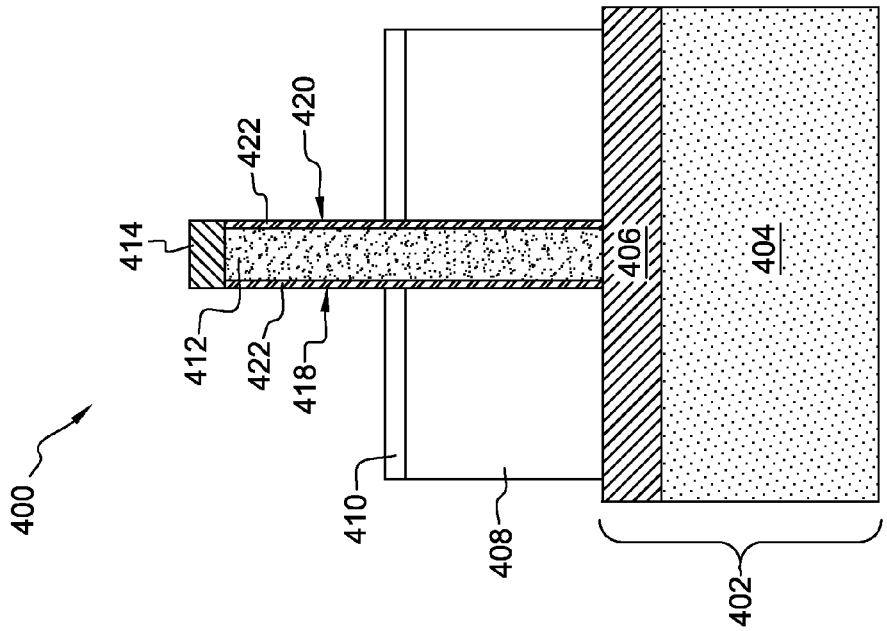
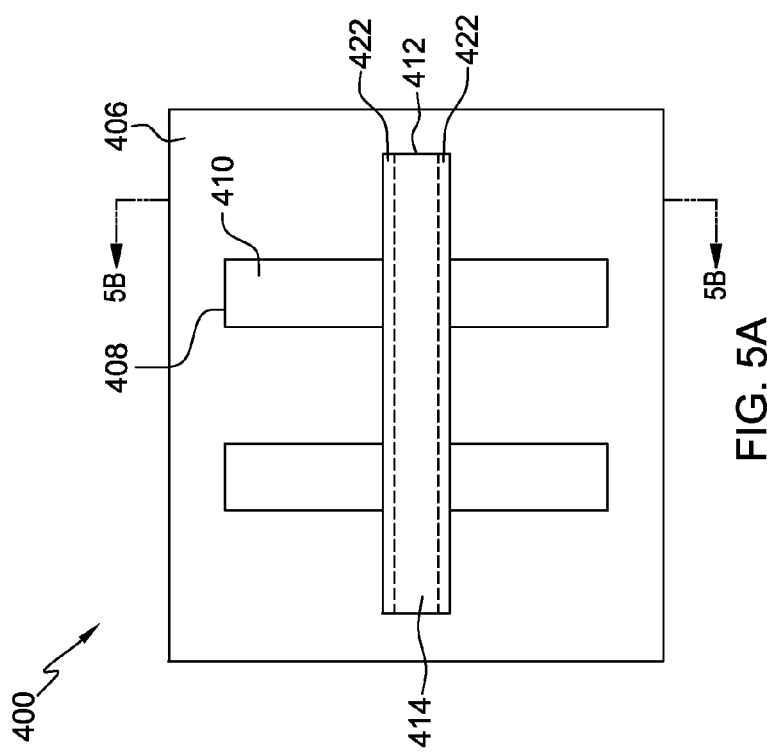
FIG. 5B
FIG. 5A

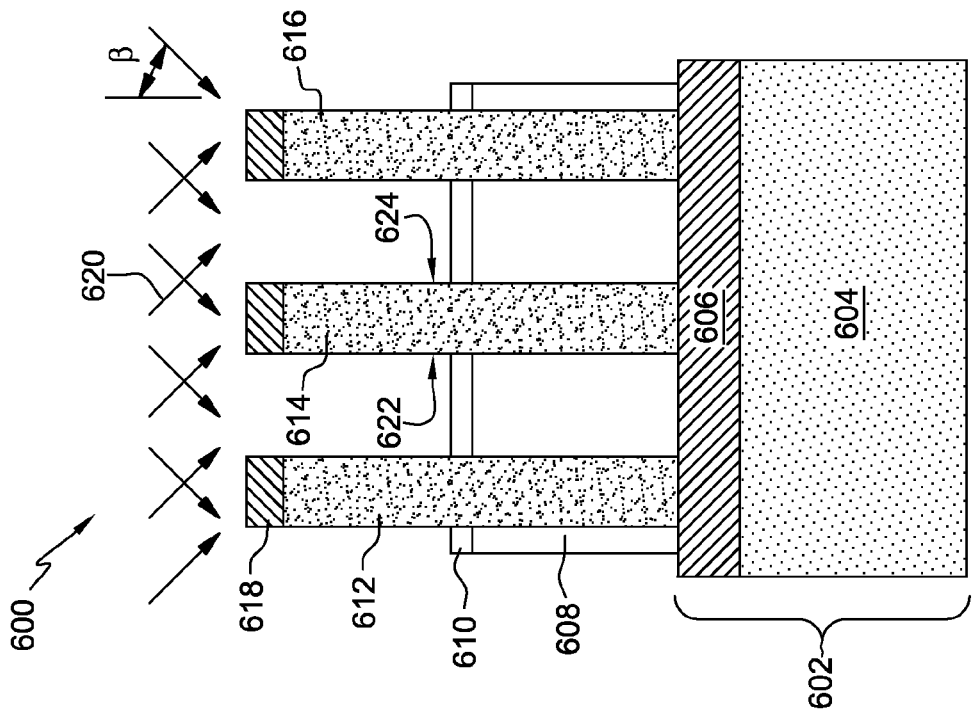
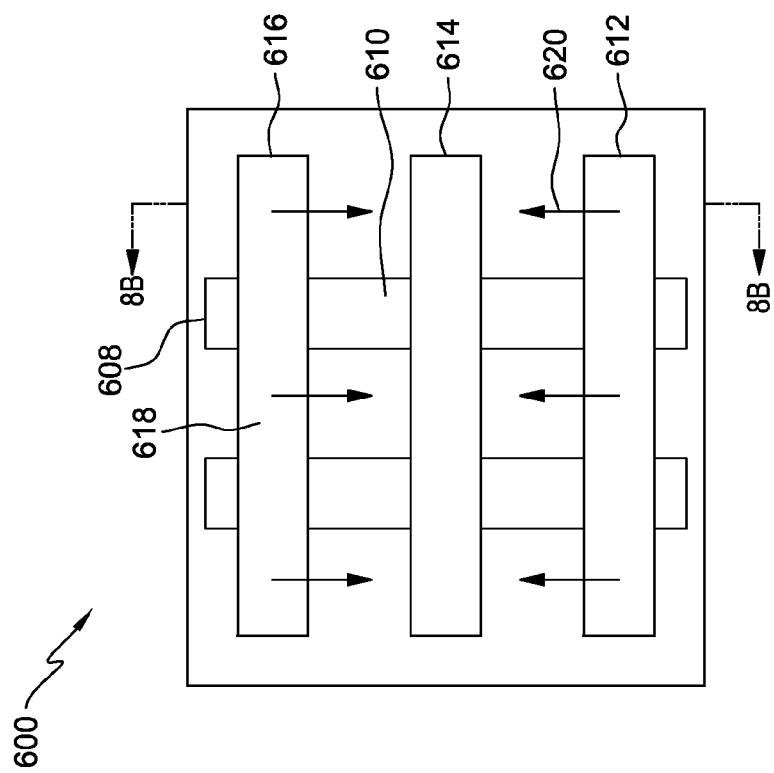

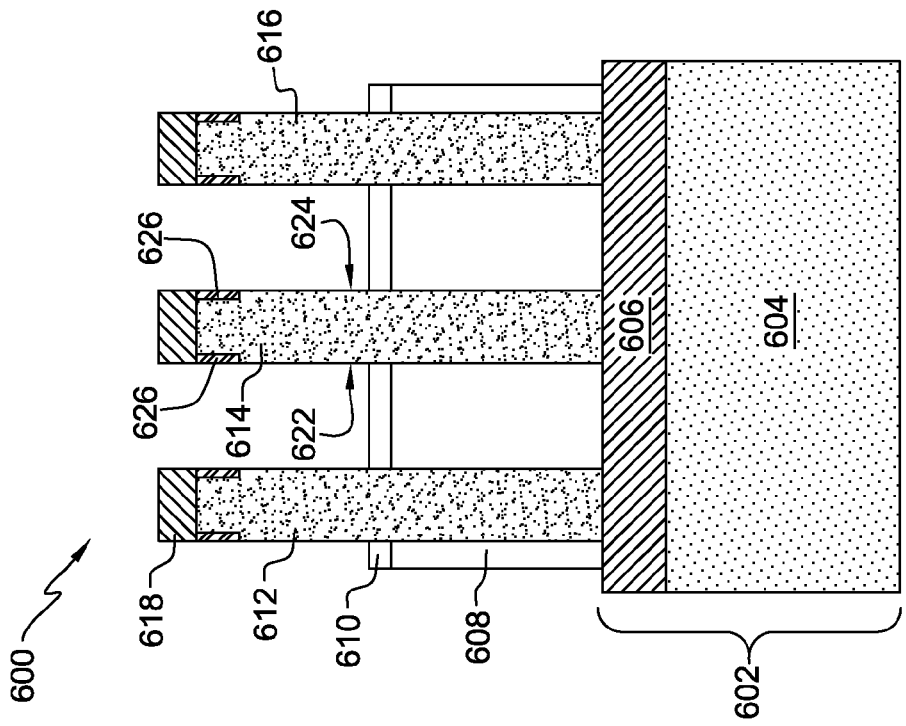
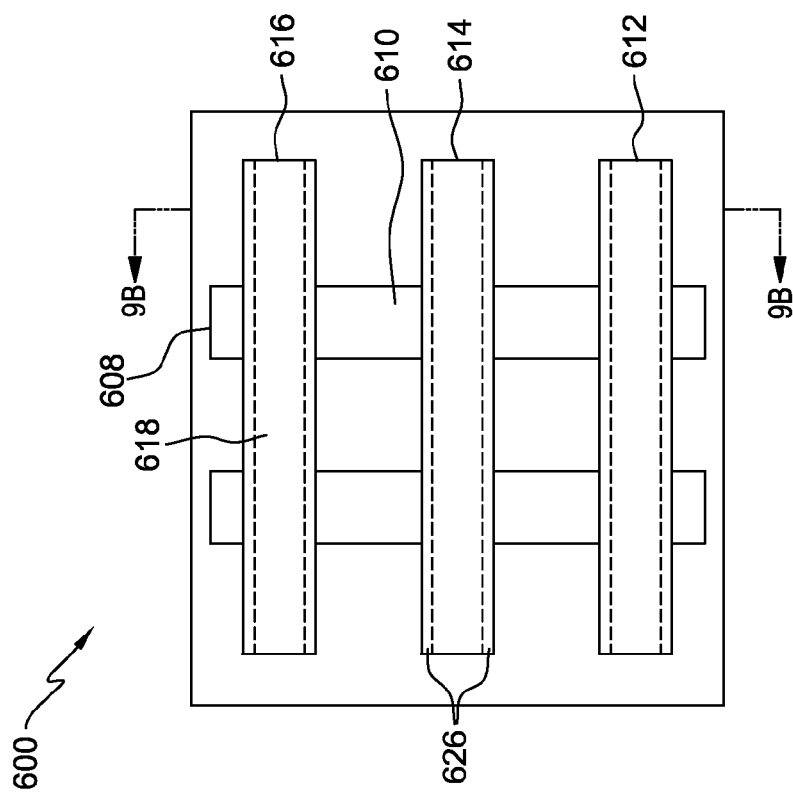

US 8,912,612 B2

SILICON NITRIDE GATE ENCAPSULATION BY IMPLANTATION

RELATED APPLICATION

This application is related to U.S. patent application Ser. No. 13/776,324, entitled "SILICON NITRIDE GATE ENCAPSULATION BY IMPLANTATION", filed Feb. 25, 2013, the disclosure of which is incorporated by reference herein.

BACKGROUND

The present invention relates to FinFET structures and, more particularly, relates to the formation of an implanted layer adjacent to the gate to seal the gate prior to a subsequent epitaxial silicon step in which raised source/drains are formed in the FinFET structure.

FinFET devices and FinFET structures are nonplanar devices and structures typically built on a semiconductor on insulator (SOI) substrate. The FinFET devices may comprise a vertical semiconductor fin, rather than a planar semiconductor surface, having a single or double gate wrapped around the fin. In an effort to provide for continued scaling of semiconductor structures to continuously smaller dimensions while maintaining or enhancing semiconductor device performance, the design and fabrication of semiconductor fin devices and semiconductor fin structures has evolved within the semiconductor fabrication art.

BRIEF SUMMARY

The various advantages and purposes of the exemplary embodiments as described above and hereafter are achieved by providing a FinFET structure including silicon fins on a semiconductor substrate, each silicon fin having two sides and a horizontal surface; a gate wrapping around at least one of the silicon fins, the gate having a first surface and an opposing second surface facing the at least one of the silicon fins; a hard mask on a top surface of the gate; a silicon nitride layer formed in each of the first and second surfaces so as to be below and in direct contact with the hard mask on the top surface of the gate; spacers on the gate and in contact with the silicon nitride layer; and epitaxially deposited silicon on the at least one of the silicon fins so as to form a raised source/drain.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 1H illustrate a process for forming fins on a semiconductor substrate wherein:

FIG. 1A illustrates a starting structure including a semiconductor on insulator (SOI) substrate, an oxide layer, an amorphous silicon layer and a hard mask layer;

FIG. 1B illustrates the patterning of the amorphous silicon layer and the hard mask layer;

FIG. 1C illustrates the removal of the hard mask layer, leaving only stripes of amorphous silicon;

FIG. 1D illustrates the deposition of a conformal layer of nitride;

FIG. 1E illustrates the etching of the nitride to form sidewall spacers;

FIG. 1F illustrates the etching of the stripes of amorphous silicon to leave only the sidewall spacers;

FIG. 1G illustrates the etching of the oxide layer and the silicon layer of the SOI substrate using the sidewall spacers as a mask to result in stripes of oxide on silicon fins; and FIG. 1H illustrates the etching of the sidewall spacers and the oxide stripes to result in silicon fins.

FIGS. 4A to 7A and 4B to 7B illustrate a first exemplary embodiment for forming a FinFET structure having a silicon nitride layer on the gate wherein:

FIGS. 4A and 4B illustrate angle implanting nitrogen into the gate;

FIGS. 5A and 5B illustrate a silicon nitride layer formed from the nitrogen-containing layer on the sides of the gate;

FIGS. 7A and 7B illustrate the formation of a raised source/drain over the fins.

FIGS. 8A to 11A and 8B to 11B illustrate a second exemplary embodiment for forming a FinFET structure having a silicon nitride layer on the gate wherein:

FIGS. 8A and 8B illustrate angle implanting silicon nitride into the gate;

FIGS. 9A and 9B illustrate the silicon nitride layer in upper portions of the sides of the gate;

FIGS. 11A and 11B illustrate the formation of a raised source/drain over the fins.

DETAILED DESCRIPTION

Figure 2:
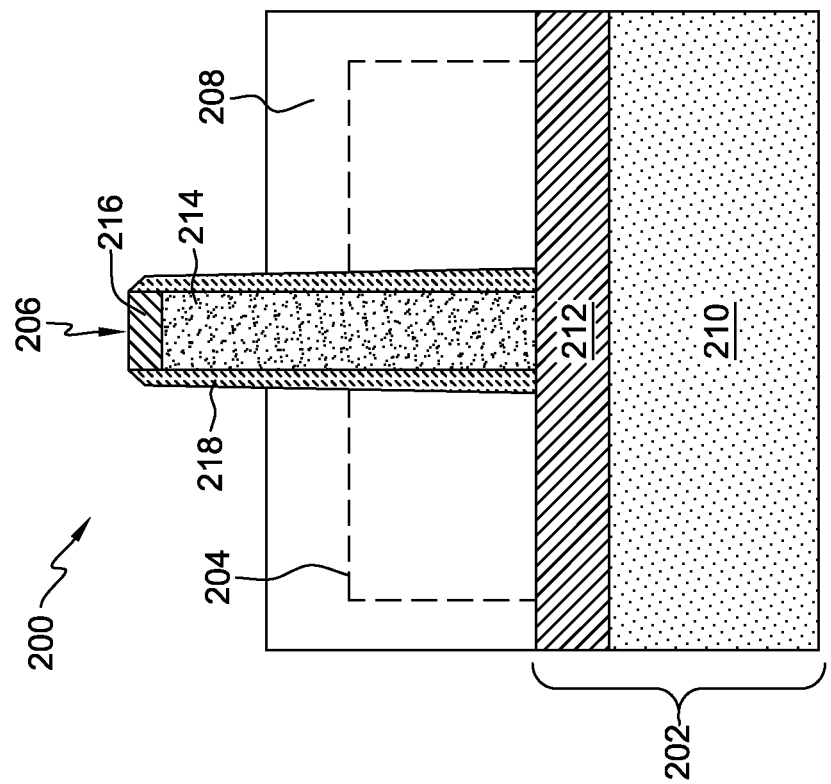
FIG. 2 is a cross-sectional view of a prior art structure of a FinFET structure comprising a fin and a raised source/drain formed by epitaxial deposition.

Referring to the Figures in more detail, and particularly referring to FIG. 2, there is disclosed a prior art FinFET structure 200 comprising a semiconductor substrate 202, fins 204, gate structure 206 and raised source/drain 208 covering the fins 204. The semiconductor substrate 202 may include a semiconductor base 210 and an oxide layer 212. The gate structure 206 may include a gate 214, a hard mask 216 on top of the gate 214, and spacers 218 on the sides of the gate 214. The spacers 218 preferably should overlap the hard mask 216 so that there is no gate 214 exposed.

A difficulty with the structure shown in FIG. 2 is that there may be some pullback of the spacer 218 and/or hard mask 216 so that part of the gate 214 is exposed. When this occurs, nodules 220 may form where the gate 214 is exposed when the raised source/drain 208 is formed. The raised source/drain 208 is formed by epitaxial deposition of silicon which will grow anywhere that silicon is exposed. Since the pullback of the spacer 218 and/or hard mask 216 may expose part of the gate 214 which is usually polysilicon, epitaxial silicon may grow on the exposed part of the gate 214, resulting in nodules 220. Nodules 220 are undesirable since if they grow large enough, they may short the raised source/drain 208 and the gate 214.

Ensuring that the sides of the gate 214 are encapsulated so that the gate 214 is never exposed to the epitaxial silicon process is a desirable advantage of the exemplary embodiments.

Referring now to FIGS. 1A to 1H, there is illustrated a preferred process for forming a semiconductor substrate having fins for practicing the exemplary embodiments. The preferred process may be referred to as the sidewall image transfer process.

Figure 1A:
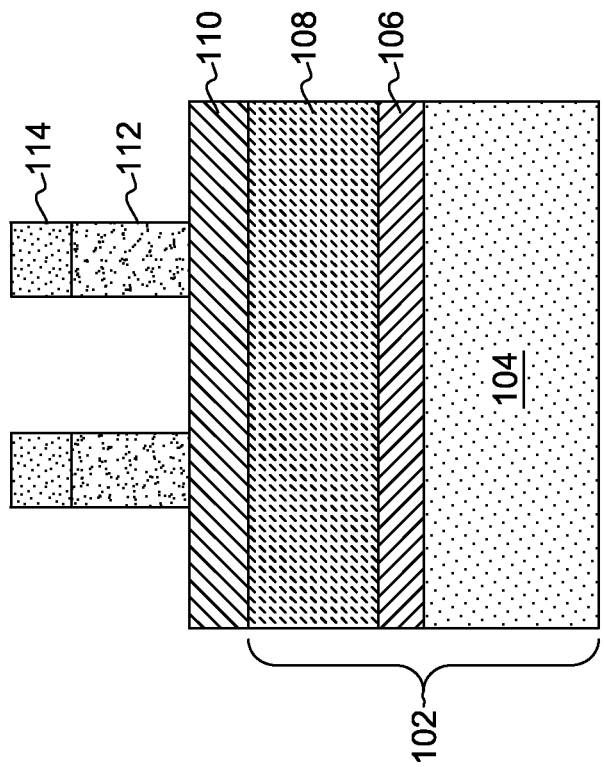

In FIG. 1A, the process begins with a semiconductor on insulator (SOI) substrate 102, also frequently referred to as a silicon on insulator substrate. The SOI substrate 102 may comprise a semiconductor base 104 (usually silicon but may be other semiconductor materials), a dielectric layer 106, usually an oxide layer (may also be called a buried oxide or BOX layer), and a semiconductor material 108, which is usually silicon. For the purposes of the present exemplary embodiments, it is preferred that semiconductor material 108 is silicon and will be referred to as such in the discussion that follows. On top of silicon 108 is an oxide layer 110, followed by an amorphous silicon layer 112 and hard mask layer 114, usually a nitride. Not shown in FIG. 1A are photoresist and other layers which may be used to pattern the hard mask layer 114.

Figure 1B:
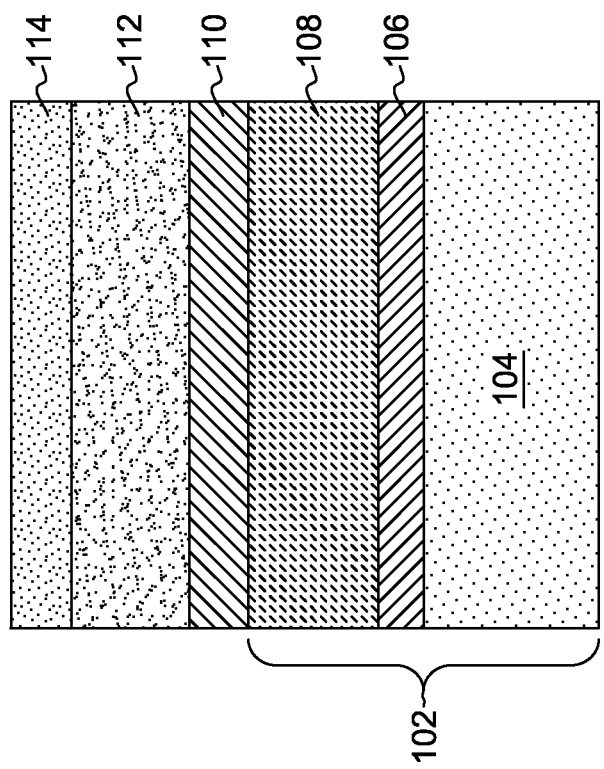

Referring now to FIG. 1B, the hard mask layer 114 has been patterned and etched down through the amorphous silicon layer 112, stopping on the oxide layer 110.

Figure 1C:
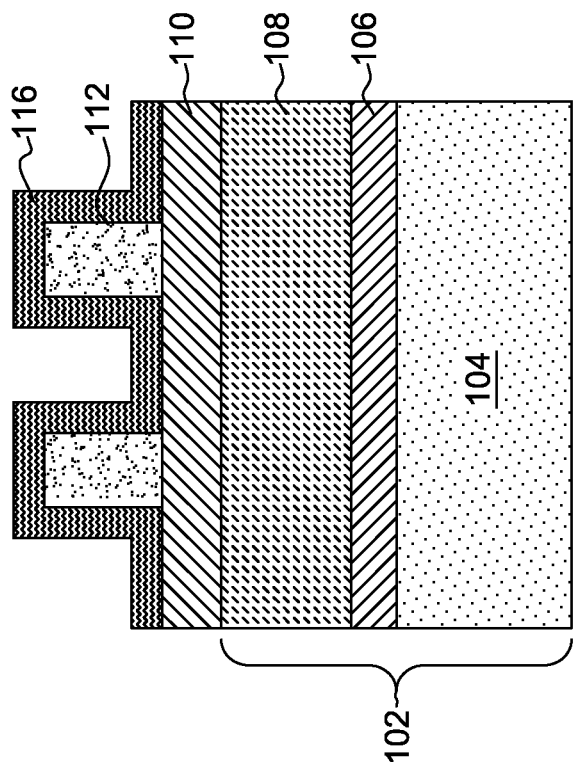

Referring now to FIG. 1C, the hard mask layer 114 has been conventionally stripped, leaving only stripes of amorphous silicon 112. Shown in FIG. 1C are only the ends of the stripes of amorphous silicon 112 which run perpendicular to the page.

Figure 1D:
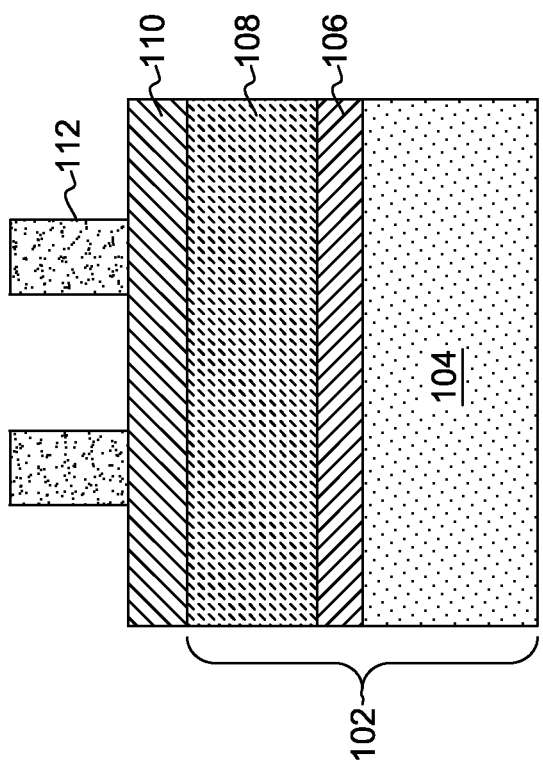

Thereafter, a conformal layer of nitride 116 is deposited over the stripes of amorphous silicon 112, as shown in FIG. 1D.

The conformal layer of nitride 116 is conventionally etched to form sidewall spacers 118, as shown in FIG. 1E, followed by conventionally etching the stripes of amorphous silicon 112 to result in only the spacers 118 left on the surface of oxide layer 110, as shown in FIG. 1F.

Using the spacers 118 as a mask, the substrate is etched to form fins 120 and stripes of oxide 122 on the fins 120 as shown in FIG. 1G.

Referring now to FIG. 1H, the spacers 118 and stripes of oxide 122 are conventionally etched to result in fins 120 on BOX layer 106.

In the description of FIGS. 4A to 11A and 4B to 11B that follows, the "A" Figure is a plan view of the FinFET structure as it is being processed and the "B" Figure is a cross-sectional view of the "A" Figure in the direction of the arrows B-B.

Referring now to FIGS. 4A and 4B, a first exemplary embodiment begins with a FinFET structure 400 comprising a semiconductor substrate 402, such as an SOI substrate, comprising a semiconductor base layer 404 and an oxide layer 406. The FinFET structure 400 further comprises a plurality of fins 408 which may have a hard mask layer 410. The presence of the hard mask layer 410 is preferred for the first exemplary embodiment. While there are only two fins 408 shown in FIGS. 4A and 4B, it should be understood that there will usually be many more such fins 408 in the FinFET structure 400.

Wrapping around the fins 408 is a gate 412 which may have a hard mask layer 414 on top of the gate 412. For the purpose of illustration and not limitation, the gate 412 wraps around both of the fins 408. In other exemplary embodiments, the gate 412 may wrap only one fin 408 or more than two fins 408. For the purpose of illustration and not limitation, the gate 412 may comprise polysilicon.

The hard mask 410 and hard mask 414 are usually a nitride, such as a silicon nitride for example. In a preferred embodiment, the hard mask 410 is an oxide.

As best seen in FIG. 4B, the FinFET structure 400 is exposed to angled implanting 416 of nitrogen which is directed against first surface 418 and second surface 420 of the gate 412. The angled implanting of nitrogen should be at a low energy, such as 5 KV (kilovolts), so that the nitrogen does not penetrate the hard mask 410 of the fins 408 or the hard mask 414 of the gate 412. The angle, $\alpha$, of the angled implanting should be at about 30 degrees with respect to the vertical. This angle of 30 degrees is preferred to avoid shadowing from nearby structures. Since the direction of implanting is parallel to the fins 408, the vertical surfaces of the fins 408 are substantially unaffected by the angled implanting 416 of the nitrogen.

The FinFET structure 400 is then annealed at about 600 to 800° C., preferably about 600° C., in a saturated nitrogen ambient for about 10 to 30 minutes to convert the implanted nitrogen layer into a silicon nitride layer. The annealing temperature is kept low enough so that silicon nitride does not form in areas where it is not desired, such as on the sides of the fins 408. While not wishing to be held to any particular theory, it is believed that the nitrogen implant breaks the silicon bonds in the gate 412 which makes it easier to form the silicon nitride layer during the annealing process. The thickness of the silicon nitride layer is about 1 to 2 nanometers.

Referring now to FIGS. 5A and 5B, gate 412 is shown having the silicon nitride layer 422 in first surface 418 and second surface 420. In the first exemplary embodiment, the silicon nitride layer 422 extends from the hard mask 414 down the entire first surface 418 and second surface 420 to oxide layer 406. While not shown in FIGS. 5A and 5B, it is within the scope of the present exemplary embodiments for silicon nitride layer to extend only part way down to oxide layer 406 although such an embodiment may require extra steps to limit coverage of the silicon nitride layer 422. However, silicon nitride layer 422 must extend to directly contact hard mask 414 to ensure that the gate 412 is not exposed during epitaxial deposition of the raised source/drain.

Figure 6B:
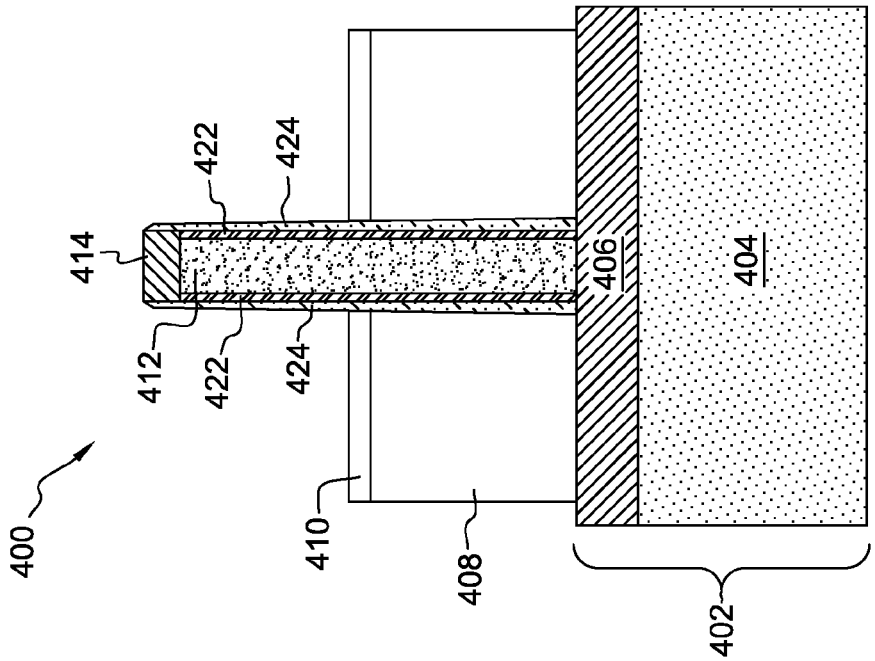
FIGS. 6A and 6B illustrate the formation of a spacer over the silicon nitride layer.
Figure 6A:
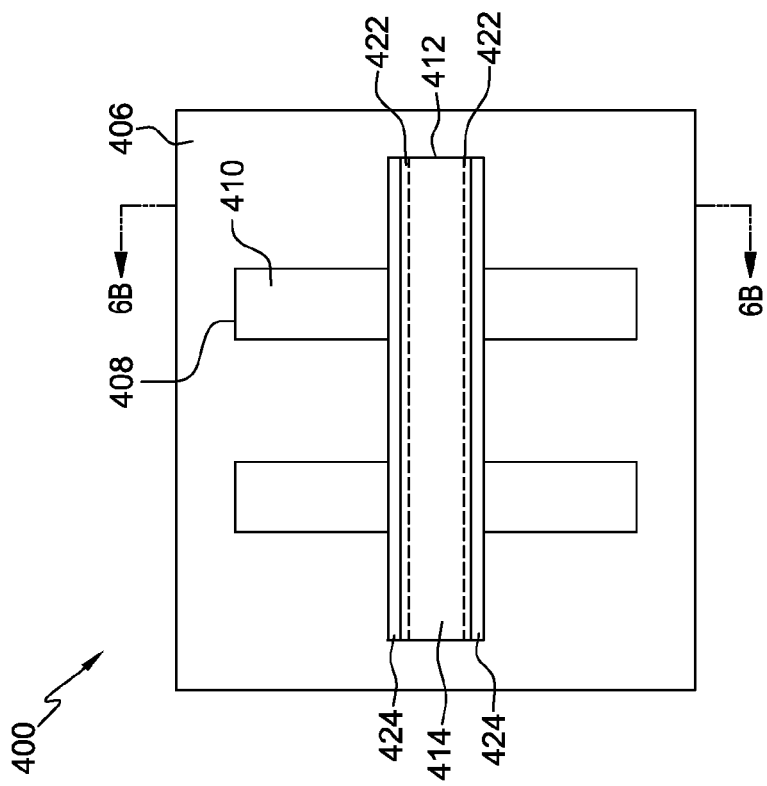

Oxide or nitride spacers may be conventionally formed by depositing oxide or nitride and then etching back to form the spacers 424 shown in FIGS. 6A and 6B. The spacers may be formed by depositing silicon nitride or silicon oxide over the silicon fins 408 and against surfaces 418, 420 of the gate 412 and then etching away the excess spacer material to leave spacers 424 against surfaces 418, 420 of the gate 412. The spacers may be formed by, for example, plasma enhanced chemical vapor deposition (PECVD) followed by a subsequent thermal process at 700° C. or more.

The silicon nitride layer 422 is situated between the gate 412 and the spacer 424 so as to seal the gate 412 on each side in case the spacer 424 and/or hard mask 414 is pulled back during the forming of the spacer 424.

Figure 7B:
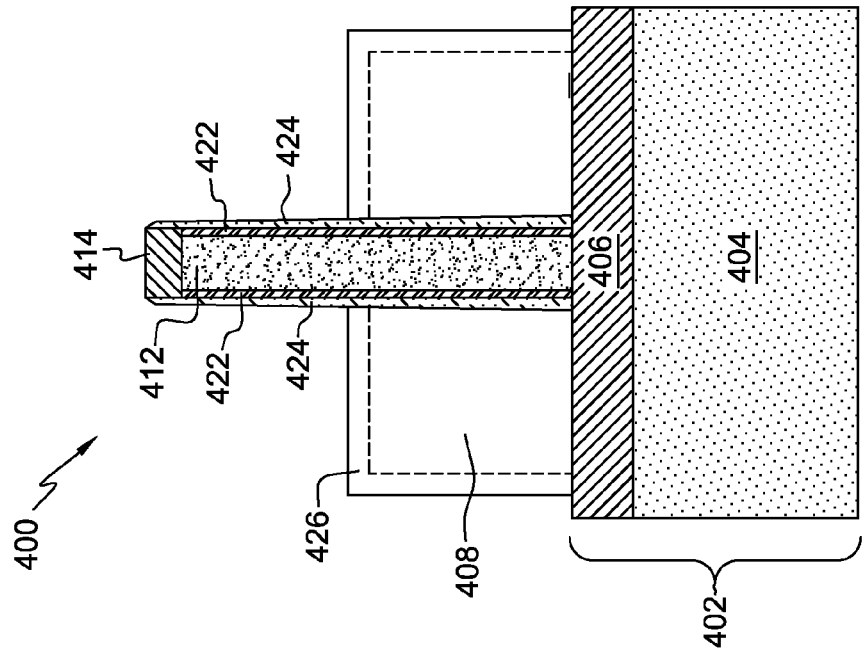
Figure 7A:
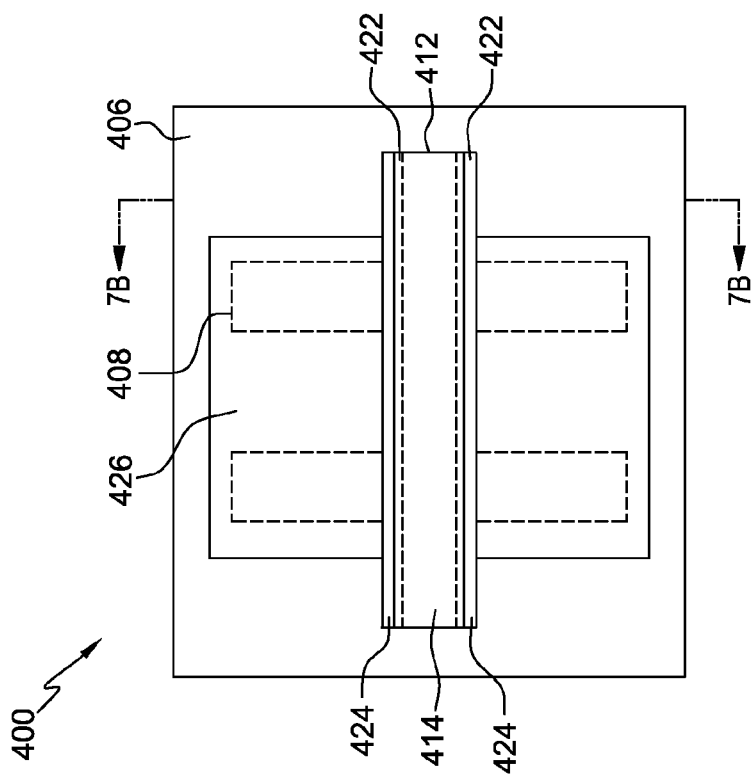

The hard mask 410 from the fins 408 may be conventionally stripped by an etch process. In the preferred embodiment where the hard mask 410 is an oxide and the hard mask 414 is a nitride, there is good etch selectivity between the oxide and nitride materials so that the hard mask 410 may be selectively etched without adversely affecting the hard mask 414. Then in a next process as shown in FIGS. 7A and 7B, epitaxial silicon is grown on the silicon fins 408 to form a merged source and drain 426. The epitaxial process to grow the epitaxial silicon may start with a hydrofluoric acid (HF) preclean, followed by a hydrogen (H2) anneal to purge out oxygen. The epitaxial silicon is achieved through a silane-based precursor to deposit epitaxial silicon on the silicon fins 408 and then form crystalline bonding. The flat surface shown for merged source and drain 426 may be achieved by an additional silicon etch back process.

Figure 3:
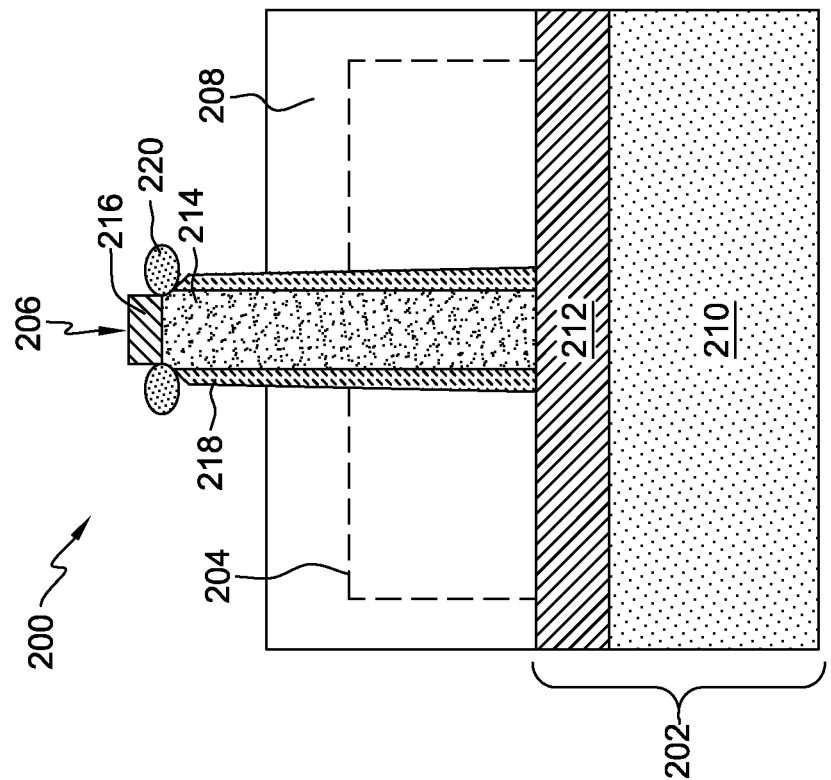
FIG. 3 is a cross-sectional view of the prior art structure of FIG. 2 wherein epitaxial nodule defects are formed on an upper part of the gate where the spacer and/or hard mask have been pulled back.

Again, because the gate 412 has been sealed, there is no longer the possibility of forming nodule defects as shown in FIG. 3.

Referring now to FIGS. 8A and 8B, a second exemplary embodiment begins with a FinFET structure 600 comprising a semiconductor substrate 602, such as an SOI substrate, comprising a semiconductor base layer 604 and an oxide layer 606. The FinFET structure 600 further comprises a plurality of fins 608 which may have a hard mask layer 610. While there are only two fins 608 shown in FIGS. 8A and 8B, it should be understood that there will usually be many more such fins 608 in the FinFET structure 600.

Wrapping around the fins 608 are a plurality of gates 612, 614, 616 which may have a hard mask layer 618 on top of each of the gates 612, 614, 616. For the purpose of illustration and not limitation, the gates 612, 614, 616 wrap around both of the fins 608. In other exemplary embodiments, the gates 612, 614, 616 may wrap around only one fin 608 or more than two fins 608. For the purpose of illustration and not limitation, the gates 612, 614, 616 may comprise polysilicon.

The hard mask 610 and hard mask 618 are usually a nitride, such as a silicon nitride for example.

While there are a plurality of gates 612, 614, 616 shown in FIGS. 8A and 8B, gates 612 and 616 are dummy gates in that their only purpose is to shadow the fins and a portion of the gate 614 during the implantation of the silicon nitride layer. The dummy gates 612, 616 may have no electrical function. Gate 614 is a functioning gate.

As best seen in FIG. 8B, the FinFET structure 600 is exposed to angled implanting 620 of silicon nitride by a process such as a gas cluster ion beam (GCIB) process. The GCIB process is a commercially available, high energy (about 60 KV) process which uses a highly pressurized reactive gas in which ionization of the reactive clusters occurs and impinges upon a surface to modify the surface upon impact. The dummy gates 612, 616 shadow the gate 614 so only a limited portion of first surface 622 and second surface 624 of the gate 614 are exposed to the GCIB process and the formation of the silicon nitride layer. The presence of the hard mask layer 610 is shown in the Figures for this second exemplary embodiment but it may not be necessary because of the presence of the dummy gates 612, 616 which shadow the fins 608 and prevent the GCIB process from contacting the fins 608.

The silicon nitride implanting is done at an angle, β, and should be at about 45 degrees with respect to the vertical. This angle of 45 degrees is preferred to avoid shadowing from nearby structures. Since the direction of implanting is parallel to the fins 608, the vertical surfaces of the fins 608 are substantially unaffected by the angled implanting 620 of the silicon nitride. The thickness of the silicon nitride layer is about 1 to 2 nanometers.

Unlike the first exemplary embodiment, there is no need to anneal the FinFET structure 600 since a silicon nitride layer forms on impact during implantation.

Referring now to FIGS. 9A and 9B, gate 614 is shown having the silicon nitride layer 626 in first surface 622 and second surface 624 of gate 614. The silicon nitride layer 626 is only in the upper portion of the gate 614. The silicon nitride layer 626 is also in the dummy gates 612, 616 but that is not important since dummy gates 612, 616 are nonfunctional.

Silicon nitride layer 626 is in direct contact with hard mask 618 to ensure that the gate 614 is not exposed during epitaxial deposition of the raised source/drain.

Figure 10B:
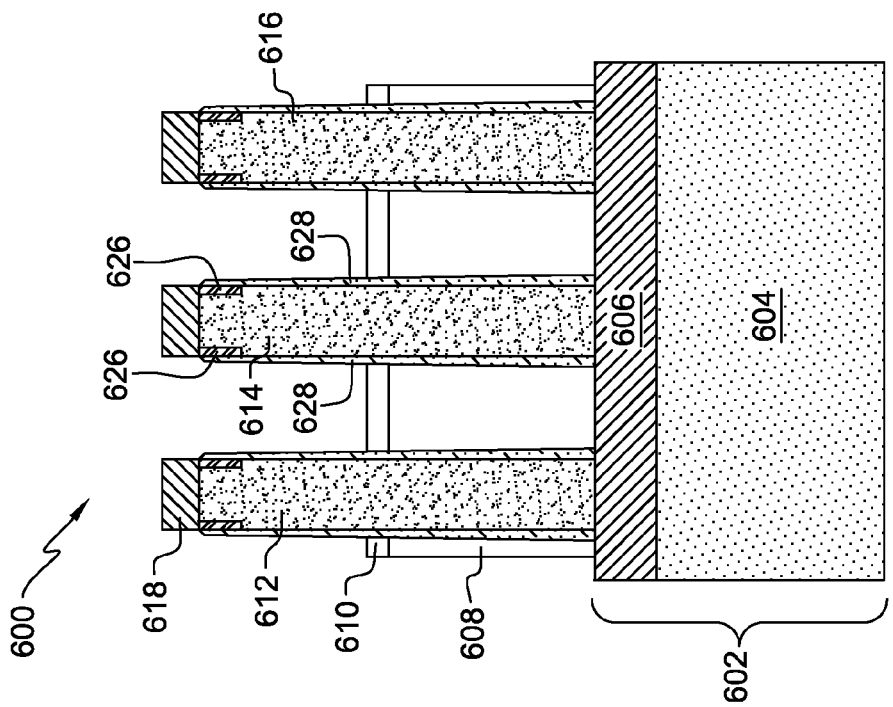
FIGS. 10A and 10B illustrate the formation of a spacer over the silicon nitride layer.
Figure 10A:
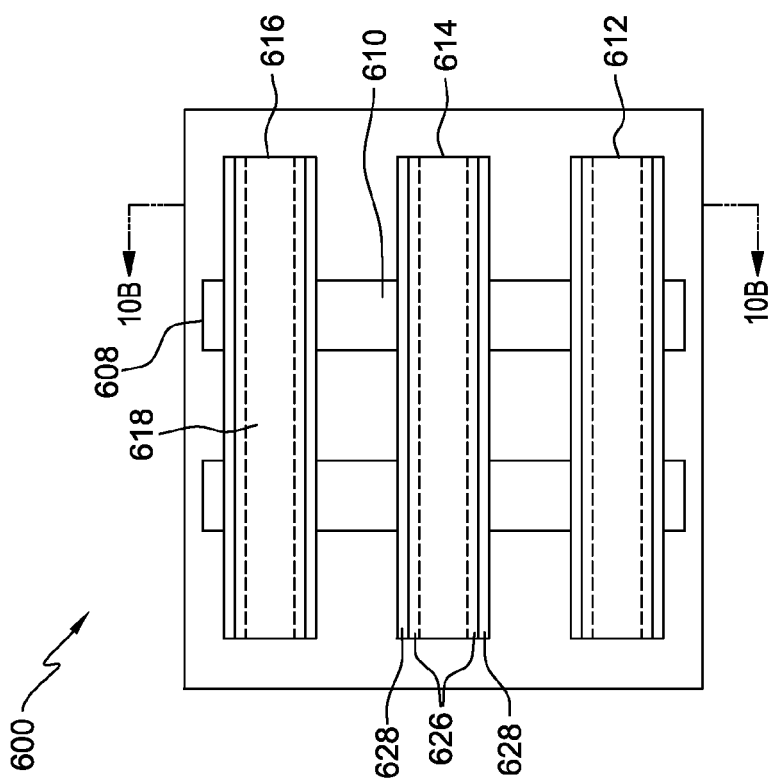

Oxide or nitride spacers may be conventionally formed by depositing oxide or nitride and then etching back to form the spacers 628 shown in FIGS. 10A and 10B. The spacers may be formed by depositing silicon nitride or silicon oxide over the silicon fins 608 and against surfaces 622, 624 of the gate 614 and then etching away the excess spacer material to leave spacers 628 against surfaces 622, 624 of the gate 614. The spacers may be formed by, for example, plasma enhanced chemical vapor deposition (PECVD) followed by a subsequent thermal process at 700° C. or more.

The silicon nitride layer 626 is situated between the gate 614 and the spacer 628 so as to seal the gate 614 on each side in case the spacer 628 and/or hard mask 618 is pulled back during the forming of the spacer 628.

Spacers 628 may also be present on the dummy gates 612, 616 but that is not important since dummy gates 612, 616 are nonfunctional.

Figure 11B:
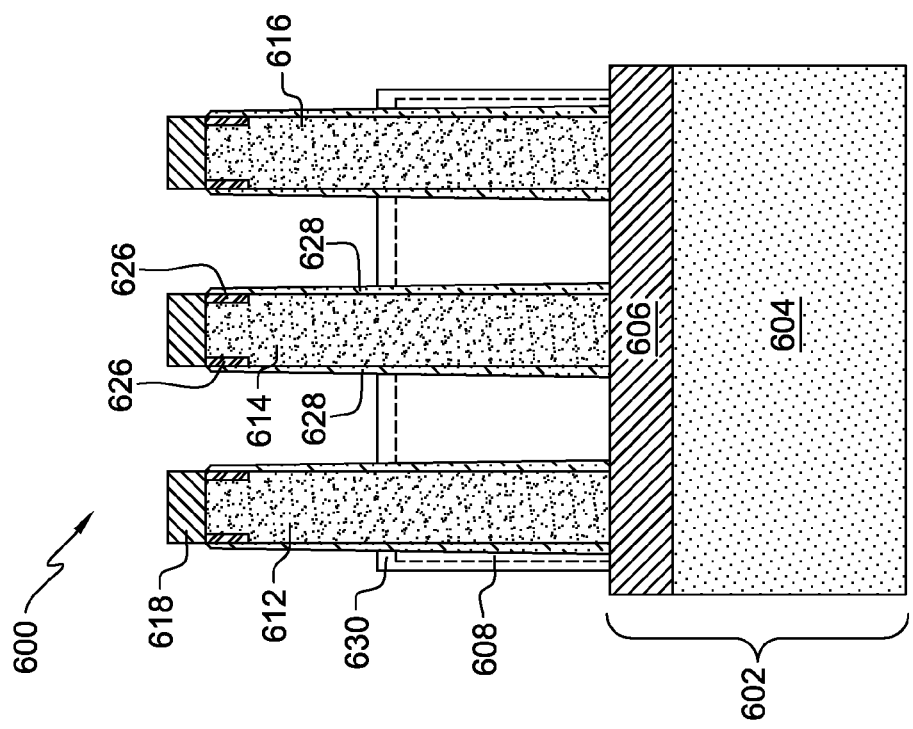
Figure 11A:
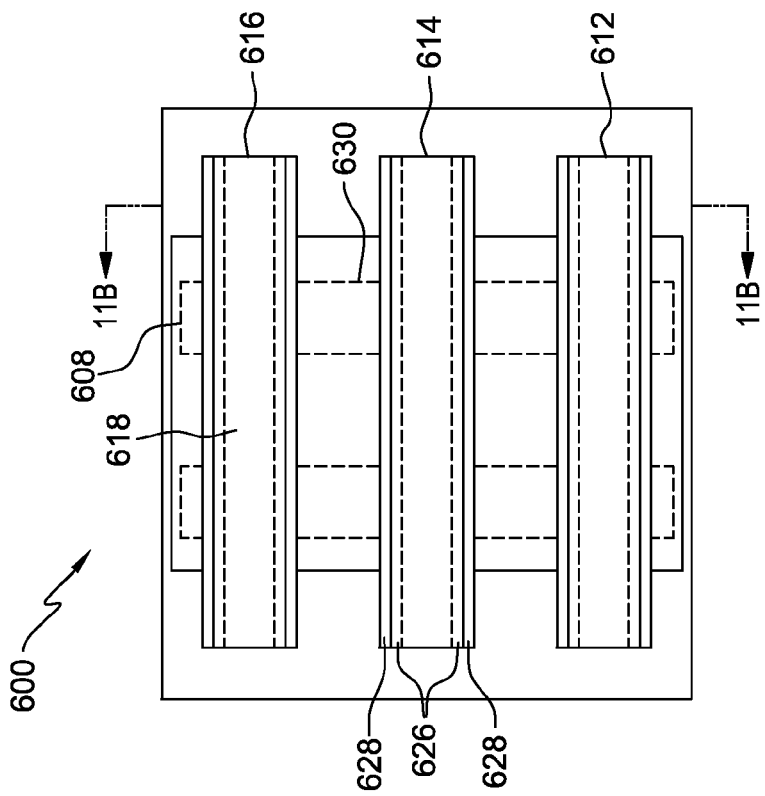

The hard mask 610, if present, on the fins 408 may be conventionally stripped. Then in a next process as shown in FIGS. 11A and 11B, epitaxial silicon is grown on the silicon fins 608 to form a merged source and drain 630. The epitaxial process to grow the epitaxial silicon may be the same as for the first exemplary embodiment.

Again, because the gate 614 has been sealed, there is no longer the possibility of forming nodule defects as shown in FIG. 3.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A FinFET structure comprising:
   silicon fins on a semiconductor substrate, each silicon fin having two sides and a horizontal surface;
   a gate wrapping around at least one of the silicon fins, the gate having a first surface and an opposing second surface facing the at least one of the silicon fins;
   a hard mask having a bottom surface on a top surface of the gate;
   a silicon nitride layer formed in each of the first and second surfaces so as to be limited to be below the hard mask and in direct contact with the bottom surface of the hard mask on the top surface of the gate;
   spacers on the gate and in contact with the silicon nitride layer; and
   epitaxially deposited silicon on the at least one of the silicon fins so as to form a raised source/drain;
   wherein the hard mask having a side surface perpendicular to the bottom surface and wherein the silicon nitride layer is only on an upper portion of the gate in direct contact with the bottom surface of the hard mask on top of the polysilicon gate and avoids any contact with the side surface of the hard mask.

2. The FinFET structure of claim 1 wherein the silicon nitride layer has a thickness of about 1 to 2 nanometers.

3. A FinFET structure comprising:
   silicon fins on a semiconductor substrate, each silicon fin having two sides and a horizontal surface;
   a gate wrapping around at least one of the silicon fins, the gate having a first surface and an opposing second surface facing the at least one of the silicon fins;

a hard mask having a bottom surface on a top surface of the gate;

a silicon nitride layer formed in each of the first and second surfaces so as to be limited to be below the hard mask and in direct contact with the bottom surface of the hard mask on the top surface of the gate, wherein the silicon nitride layer is only on an upper portion of the gate in direct contact with the hard mask on top of the polysilicon gate;

spacers on the gate and in contact with the silicon nitride layer;

epitaxially deposited silicon on the at least one of the silicon fins so as to form a raised source/drain; and further comprising a plurality of dummy gates across at least one of the silicon fins such that there is a first dummy gate spaced from and facing the first surface of the gate and a second dummy gate spaced from and facing the second surface of the gate, the plurality of dummy gates performing no electrical function.

4. The FinFET structure of claim 1 wherein the silicon nitride layer is in direct contact with each of the first and second surfaces.

5. The FinFET structure of claim 1 wherein the spacers are in direct contact with the silicon nitride layer.

\* \* \* \* \*